United States Patent
Cui et al.

(10) Patent No.: US 10,810,925 B2
(45) Date of Patent: Oct. 20, 2020

(54) PIXEL UNIT, DISPLAY SUBSTRATE AND METHOD FOR MANUFACTURING DISPLAY SUBSTRATE

(71) Applicants: Hefei BOE Optoelectronics Technology Co., Ltd., Anhui (CN); BOE Technology Group Co., Ltd., Beijing (CN)

(72) Inventors: Xiujuan Cui, Beijing (CN); Jingjing Li, Beijing (CN); Guilin Liu, Beijing (CN); Jian Li, Beijing (CN); Wenjie Xu, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/383,988

(22) Filed: Apr. 15, 2019

(65) Prior Publication Data
US 2020/0058245 A1 Feb. 20, 2020

(30) Foreign Application Priority Data
Aug. 17, 2018 (CN) .......................... 2018 1 0946419

(51) Int. Cl.
*G09G 3/3208* (2016.01)
*G09G 3/20* (2006.01)
(Continued)

(52) U.S. Cl.
CPC ......... *G09G 3/2003* (2013.01); *G09G 3/3208* (2013.01); *H01L 27/3216* (2013.01);
(Continued)

(58) Field of Classification Search
CPC ..... G09G 3/2003; G09G 3/3208–3291; G09G 2300/0452; H01L 27/3216; H01L 27/3218; H01L 51/5012; H01L 51/56
See application file for complete search history.

(56) References Cited

U.S. PATENT DOCUMENTS

| 7,825,584 B2 | 11/2010 | Kim |
| 2007/0046185 A1 | 3/2007 | Kim |

(Continued)

FOREIGN PATENT DOCUMENTS

| CN | 1921140 A | 2/2007 |
| CN | 104409474 A | 3/2015 |

(Continued)

OTHER PUBLICATIONS

First Office Action, including Search Report, for Chinese Patent Application No. 201810946419.4, dated Apr. 1, 2020, 16 pages.

*Primary Examiner* — William Boddie
(74) *Attorney, Agent, or Firm* — Westman, Champlin & Koehler, P.A.

(57) ABSTRACT

Embodiments of the present disclosure provide a pixel unit, a display substrate, and a method for manufacturing the display substrate. The pixel unit includes: a first sub-pixel region; a second sub-pixel region located at a periphery of the first sub-pixel region and surrounding the first sub-pixel region; and a third sub-pixel region located at a periphery of the second sub-pixel region and surrounding the second sub-pixel region.

17 Claims, 11 Drawing Sheets

(51) Int. Cl.
 *H01L 27/32* (2006.01)
 *H01L 51/50* (2006.01)
 *H01L 51/56* (2006.01)

(52) U.S. Cl.
 CPC ...... *H01L 27/3218* (2013.01); *H01L 51/5012* (2013.01); *H01L 51/56* (2013.01); *G09G 2300/0452* (2013.01)

(56) References Cited

U.S. PATENT DOCUMENTS

2009/0128473 A1* 5/2009 Yamashita ............ G09G 3/2074
 345/89
2018/0012943 A1* 1/2018 Ikeda .................. H01L 27/3216

FOREIGN PATENT DOCUMENTS

CN 107452778 A 12/2017
JP 2007026947 A 2/2007

* cited by examiner

PIXEL UNIT, DISPLAY SUBSTRATE AND METHOD FOR MANUFACTURING DISPLAY SUBSTRATE

CROSS-REFERENCE TO RELATED APPLICATION

This application claims priority of Chinese Patent Application No. 201810946419.4 filed on Aug. 17, 2018 in the China National Intellectual Property Administration, the disclosure of which is incorporated herein by reference in entirety.

TECHNICAL FIELD

Embodiments of the present disclosure relate to the field of display technology, and in particular, to a pixel unit, a display substrate including the pixel unit, and a method for manufacturing the display substrate.

BACKGROUND

Organic light emitting diodes (OLEDs) represent a developing direction of display technology and are more and more concerned. OLED display technology has advantages of self-illumination, high brightness, high efficiency, fast response, low voltage drive and low power consumption, low cost, few processes and so on. OLED technology is widely used in mobile phones, digital video cameras, DVD players, personal digital assistants (PDAs), notebook computers, car stereos and televisions.

In the related art, taking an RGB three-color OLED display panel as an example, the arrangement mode of sub-pixels on the display panel mainly includes a standard RGB arrangement mode and a PenTile arrangement mode. In the standard RGB arrangement mode, each pixel is composed of three sub-pixels of red, green and blue; while in the PenTile arrangement mode, each pixel is composed of only two sub-pixels of red and green, or blue and green.

SUMMARY

Some embodiments of the present disclosure provide a pixel unit, comprising:

a first sub-pixel region;

a second sub-pixel region located at a periphery of the first sub-pixel region and surrounding the first sub-pixel region; and a third sub-pixel region located at a periphery of the second sub-pixel region and surrounding the second sub-pixel region.

In some embodiments, the first sub-pixel region, the second sub-pixel region, and the third sub-pixel region have a same area.

In some embodiments, the first sub-pixel region has a square shape.

In some embodiments, an area of the second sub-pixel region is equal to an area of the third sub-pixel region, and an area of the first sub-pixel region is half of the area of the second sub-pixel region.

In some embodiments, centers of the first sub-pixel region, the second sub-pixel region, and the third sub-pixel region coincide with each other.

In some embodiments, any two of the first sub-pixel region, the second sub-pixel region, and the third sub-pixel region have different illuminant color.

In some embodiments, the pixel unit comprises a light emitting diode.

In some embodiments, centers of the first sub-pixel region, the second sub-pixel region, and the third sub-pixel region do not coincide with each other.

In some embodiments, the pixel unit further comprises at least one additional sub-pixel region other than the first sub-pixel region, the second sub-pixel region, and the third sub-pixel region, and the at least one additional sub-pixel region surrounds the third sub-pixel region or surrounds the periphery of the third sub-pixel region in a one-surrounding-one manner.

Some embodiments of the present disclosure further provide a display substrate, comprising:

a base substrate; and a plurality of pixel units according to any one of the above embodiments arranged in an array on the base substrate.

In some embodiments, in two adjacent pixel units, an illuminant color of the first sub-pixel region of one of the pixel units and an illuminant color of the third sub-pixel region of the other of the pixel units are same.

In some embodiments, in the two adjacent pixel units, an illuminant color of the second sub-pixel region of the one of the pixel units and an illuminant color of the first sub-pixel region of the other of the pixel units are same; or wherein, in the two adjacent pixel units, the illuminant color of the second sub-pixel region of the one of the pixel units and an illuminant color of the second sub-pixel region of the other of the pixel units are same.

In some embodiments, in two adjacent pixel units, an illuminant color of the first sub-pixel region of a first pixel unit and an illuminant color of the second sub-pixel region of a second pixel unit are same, an illuminant color of the second sub-pixel region of the first pixel unit and an illuminant color of the third sub-pixel region of the second pixel unit are same, and an illuminant color of the third sub-pixel region of the first pixel unit and an illuminant color of the first sub-pixel region of the second pixel unit are same.

In some embodiments, in two adjacent pixel units, an illuminant color of the first sub-pixel region of a first pixel unit and an illuminant color of the second sub-pixel region of a second pixel unit are same, an illuminant color of the second sub-pixel region of the first pixel unit and an illuminant color of the first sub-pixel region of the second pixel unit are same, and an illuminant color of the third sub-pixel region of the first pixel unit and an illuminant color of the third sub-pixel region of the second pixel unit are same.

In some embodiments, in two adjacent pixel units, an illuminant color of the first sub-pixel region of a first pixel unit and an illuminant color of the first sub-pixel region of a second pixel unit are same, an illuminant color of the second sub-pixel region of the first pixel unit and an illuminant color of the third sub-pixel region of the second pixel unit are same, and an illuminant color of the third sub-pixel region of the first pixel unit and an illuminant color of the second sub-pixel region of the second pixel unit are same.

In some embodiments, in two adjacent pixel units, the first sub-pixel regions each have a first illuminant color, the second sub-pixel regions each have a second illuminant color, and the third sub-pixel regions each have a third illuminant color.

In some embodiments, a separation distance between sub-pixel regions having a same illuminant color in two adjacent pixel units is less than two-thirds of a width of any one of the pixel units.

Some embodiments of the present disclosure further provide a method for manufacturing a display substrate, comprising:
providing a base substrate;
forming a plurality of pixel units in an array on the base substrate,
wherein each of the pixel units comprises:
a first sub-pixel region;
a second sub-pixel region located at a periphery of the first sub-pixel region and surrounding the first sub-pixel region; and
a third sub-pixel region located at a periphery of the second sub-pixel region and surrounding the second sub-pixel region.

In some embodiments, the forming a plurality of pixel units in an array on the base substrate comprises:
forming a first color layer pattern in the first sub-pixel region, a second color layer pattern in the second sub-pixel region, and a third color layer pattern in the third sub-pixel region on the base substrate, respectively,
wherein, in each pixel unit, the second color layer pattern surrounds the first color layer pattern, and the third color layer pattern surrounds the second color layer pattern.

In some embodiments, the first color layer pattern, the second color layer pattern, and the third color layer pattern are respectively made from luminescent material layers of different colors or color filter layers of different colors.

BRIEF DESCRIPTION OF THE DRAWINGS

In order to more clearly illustrate the technical solutions in the embodiments of the present disclosure, the drawings for illustrating the embodiments will be briefly described below, and it should be understood that the drawings described below only relate to some embodiments of the present disclosure, rather than limiting the present disclosure. In the drawings.

DETAILED DESCRIPTION OF EMBODIMENTS

Figure 1:
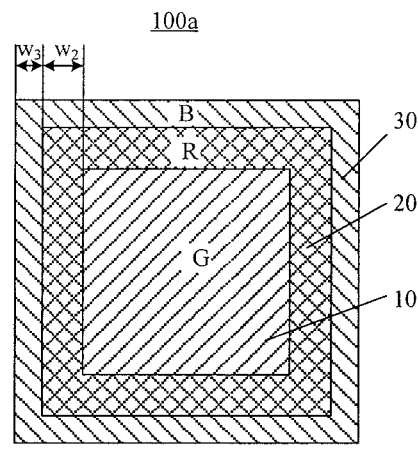
FIG. 1 is a schematic structural view of a pixel unit according to an embodiment of the present disclosure.

In order to more clearly illustrate the objectives, technical solutions and advantages of the present disclosure, the embodiments of the present disclosure will be described in detail below with reference to the accompanying drawings. It is to be understood that the following description of the embodiments is intended to explain and describe the general concept of the present disclosure, but should not be interpreted as limiting the present disclosure. In the specification and drawings, the same or similar reference numerals refer to the same or similar components or members. For the sake of clarity, the drawings are not necessarily drawn to scale, and some of well-known components and structures may be omitted in the drawings.

Unless otherwise defined, technical terms or scientific terms used in the present disclosure have the general meanings as understood by those skilled in the art. The words "first", "second" and the like used in the present disclosure do not denote any order, quantity, or importance, but are only used to distinguish different components. The word "a" or "an" does not exclude a plurality of the items in question. The word "comprise", "include" or the like means that the element or item preceding the word covers the elements or items listed behind the word and equivalents thereof, but does not exclude other elements or items. The word "connect", "join" or the like are not limited to physical or mechanical connection, but may include electrical connection, whether direct or indirect. "Upper", "lower", "left", "right", "top", "bottom or the like are only used to indicate relative positional relationship. If the absolute position of the described object is changed, then the relative positional relationship may also accordingly changed. If an element such as a layer, a film, a region or a base substrate is referred to as being located "above" or "below" another element, the element may be "directly" located "above" or "below" the another element, or there may be intermediate elements therebetween.

FIG. 1 illustrates a pixel unit 100a according to an embodiment of the present disclosure. The pixel unit 100a includes a first sub-pixel region 10, a second sub-pixel region 20, and a third sub-pixel region 30. The second sub-pixel region 20 is located at a periphery of the first sub-pixel region 10 and surrounds the first sub-pixel region 10. The third sub-pixel region 30 is located at a periphery of the second sub-pixel region 20 and surrounds the second sub-pixel region 20. As an example, the first sub-pixel region 10 may be located at a center position (not at an edge position) of the pixel unit 100a.

As a specific example, the first sub-pixel region 10 is of a rectangle, optionally a square; the second sub-pixel region 20 is of a rectangular ring or a hollow rectangle, optionally a hollow square; the third sub-pixel region 30 is of a rectangular ring or a hollow rectangle, optionally a hollow square.

In some embodiments of the present disclosure, each sub-pixel region includes not only a display region portion but also a non-display region portion.

In some embodiments of the present disclosure, the arrangement that "the second sub-pixel region surrounds the first sub-pixel region" does not mean that the center of the second sub-pixel region necessarily coincides with the center of the first sub-pixel region, actually the center of the second sub-pixel region may offset from the center of the first sub-pixel region to some extent. Similarly, the arrangement that "the third sub-pixel region surrounds the second sub-pixel region" does not mean that the center of the third sub-pixel region necessarily coincides with the center of the second sub-pixel region, actually the center of the third sub-pixel region may also offset from the center of the second sub-pixel to some extent. However, in order to enable the second sub-pixel region 20 and the third sub-pixel region 30 to be more evenly distributed around the first sub-pixel region 10, the centers of the first sub-pixel region 10, the second sub-pixel region 20, and the third sub-pixel regions 30 may coincide with each other. In this case, it is advantageous to maintain the uniformity of the width w2 of sides of the second sub-pixel region 20 and the width w3 of sides of the third sub-pixel region 30 (as shown in FIG. 1), to prevent the width w2 of sides of the second sub-pixel region 20 and the width w3 of sides of the third sub-pixel region 30 from being too narrow in some portions. The width w2 of sides of the second sub-pixel region 20 and the width w3 sides of the third sub-pixel region 30 to be excessive narrow may increase the manufacturing difficulty.

In some embodiments of the present disclosure, the first sub-pixel region 10, the second sub-pixel region 20, and the third sub-pixel region 30 may have different illuminant colors. For example, for the case of RGB (red, green, and blue) sub-pixel display, the first sub-pixel region 10, the second sub-pixel region 20, and the third sub-pixel region 30 may be used to emit green light, red light, and blue light, respectively. FIGS. 1 to 6 illustrate six examples of the combination of the first sub-pixel region 10, the second sub-pixel region 20, and the third sub-pixel region 30 having different illuminant colors in the pixel unit.

In the drawings of the present disclosure, the sub-pixel region with red illuminant color is labeled as R, the sub-pixel region with green illuminant color is labeled as G, and the sub-pixel region with blue illuminant color is labeled as B.

In the exemplary pixel unit 100a shown in FIG. 1, the illuminant color of the first sub-pixel region 10 is green (represented by left diagonals), and the illuminant color of the second sub-pixel region 20 is red (represented by intersection lines), and the illuminant color of the third sub-pixel region 30 is blue (represented by right diagonals). In the exemplary pixel unit 100b shown in FIG. 2, the illuminant color of the first sub-pixel region 10 is blue, the illuminant color of the second sub-pixel region 20 is green, and the illuminant color of the third sub-pixel region 30 is red. In the exemplary pixel unit 100c shown in FIG. 3, the illuminant color of the first sub-pixel region 10 is red, the illuminant color of the second sub-pixel region 20 is blue, and the illuminant color of the third sub-pixel region 30 is green. In the exemplary pixel unit 100d shown in FIG. 4, the illuminant color of the first sub-pixel region 10 is green, the illuminant color of the second sub-pixel region 20 is blue, and the illuminant color of the third sub-pixel region 30 is red. In the exemplary pixel unit 100e shown in FIG. 5, the illuminant color of the first sub-pixel region 10 is blue, the illuminant color of the second sub-pixel region 20 is red, and the illuminant color of the third sub-pixel region 30 is green. In the exemplary pixel unit 100f shown in FIG. 6, the illuminant color of the first sub-pixel region 10 is red, the illuminant color of the second sub-pixel region 20 is green, and the illuminant color of the third sub-pixel region 30 is blue.

In the embodiments of the present disclosure, the green illuminant color is represented by left diagonals, the red illuminant color is represented by intersection lines, and the blue illuminant color is represented by right diagonals.

In the pixel units 100a, 100b, 100c, 100d, 100e, and 100f according to the embodiments of the present disclosure, different sub-pixel regions are arranged from the center to the periphery of the pixel in a one-surrounding-one manner, which is different from the arrangement mode in which the strip-shaped sub-pixel regions are arranged in parallel in the related art (for example, the standard RGB arrangement mode or the PenTile arrangement mode).

Figure 7:
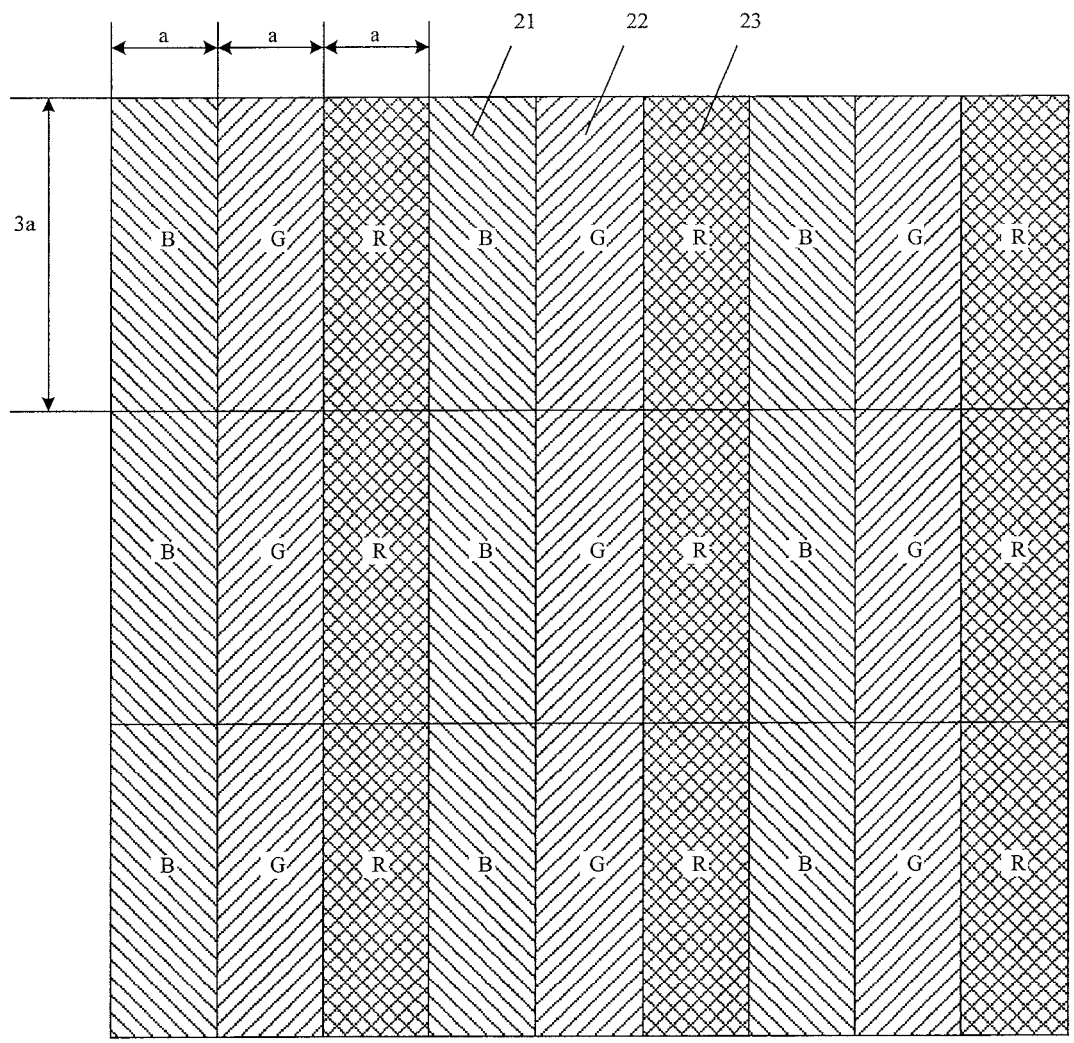
FIG. 7 is a schematic view showing sub-pixel regions on a display substrate arranged in a standard RGB arrangement mode.

FIG. 7 is a schematic view showing sub-pixel regions arranged in a standard RGB arrangement mode. FIG. 7 shows 3×3 pixels. In FIG. 7, each pixel unit includes three elongated sub-pixel regions, respectively, a blue sub-pixel region 21, a green sub-pixel region 22, and a red sub-pixel region 23. Assuming that each sub-pixel region has a width of a and a length of 3a, the pixel unit composed of three sub-pixel regions may be regarded as a square having a side length of 3a. In this case, a distance between the sub-pixel regions having the same illuminant color (for example, the blue sub-pixel regions 21, the green sub-pixel regions 22, or the red sub-pixel regions 23) in two adjacent pixel units is 2a.

Figure 8:
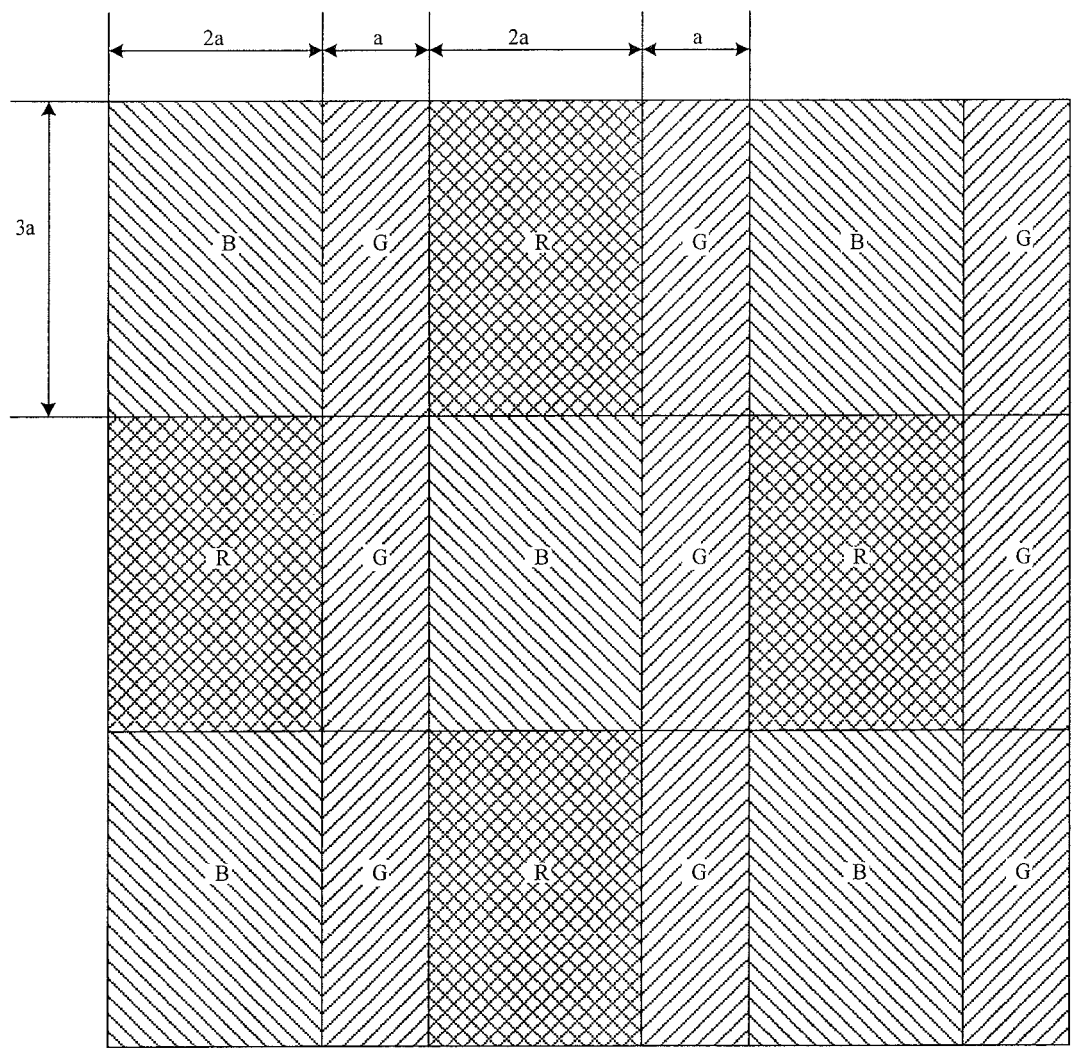
FIG. 8 is a schematic view showing sub-pixel regions on a display substrate arranged in a PenTile arrangement mode.

FIG. 8 is a schematic view showing sub-pixel regions arranged in a PenTile arrangement mode. Unlike the above-described RGB standard arrangement mode, in the PenTile arrangement mode, each pixel unit includes only two sub-pixel regions (for example, red and green sub-pixel regions, or blue and green sub-pixel regions). As can be seen by comparing FIG. 7 with FIG. 8, in the case where 3×3 pixels are needed to be displayed, nine sub-pixel regions need to be included in one row of sub-pixels (horizontally arranged from left to right in FIGS. 7 and 8) for the RGB standard arrangement mode, while only six sub-pixel regions need to be included in one row of sub-pixels for the PenTile arrangement mode. However, for the RGB display mode, only if three primary colors are simultaneously included, it can constitute all the colors, in other words, only two colors cannot constitute all the colors. Therefore, when actually displaying an image, one pixel unit arranged in the PenTile arrangement mode needs to borrow another color of the pixel unit adjacent thereto to constitute the three primary colors. In other words, the PenTile arrangement mode of the RGB sub-pixel regions reduces the number of sub-pixel regions by sharing the sub-pixel regions with the adjacent pixel units. For the sake of comparison, it is assumed that the pixel unit arranged in the PenTile arrangement mode may also be regarded as a square having a side length of 3a, and two sub-pixel regions in the pixel unit may be regarded as a rectangle having a length of 3a and a width of a and a rectangle having a length of 3a and a width of 2a, respectively. In this case, there are two kinds of separation distances between the closest sub-pixel regions having the same illuminant color, that is, 2a (for example, the separation distance between the green sub-pixel regions in FIG. 8) and 4a (for example, the separation distance between the blue sub-pixel regions in FIG. 8). It can be seen that the separation distance between the same-illuminant color sub-pixel regions arranged in the PenTile arrangement mode is greater than the separation distance between the same-illuminant color sub-pixel regions arranged in the standard RGB arrangement mode. In general, the larger the separation distance between the same-illuminant color sub-pixel regions is, the worse the effect for displaying color separation regions is.

Advantages of the pixel unit employing a one-surrounding-one sub-pixel arrangement mode according to the embodiments of the present disclosure will be described below by comparison.

Some embodiments of the present disclosure provide a display substrate 200. The display substrate 200 includes: a base substrate 40; and a plurality of pixel units disposed in an array on the base substrate 40. The pixel units may be the pixel units described in any of the above embodiments.

FIGS. 9, 10, 11, and 12 illustrate four exemplary arrangements mode of pixel units on a display substrate according to embodiments of the present disclosure, respectively. In order to facilitate the comparison with the standard RGB arrangement mode or the PenTile arrangement mode, in FIGS. 9, 10, 11, and 12, each of the pixel units 100a to 100f is regarded as a square having a side length of 3a. Assuming that the areas of the first sub-pixel region 10, the second sub-pixel region 20, and the third sub-pixel region 30 are equal such that illuminant areas of the various sub-pixel regions having different illuminant colors are the same, the first sub-pixel region 10 has a side length of $3^{1/2}a$ (about 1.73a), a side length of the outer side of the second sub-pixel region 20 is $6^{1/2}a$ (about 2.45 a), and the third sub-pixel region 30 has a side length of 3a.

Figure 6:
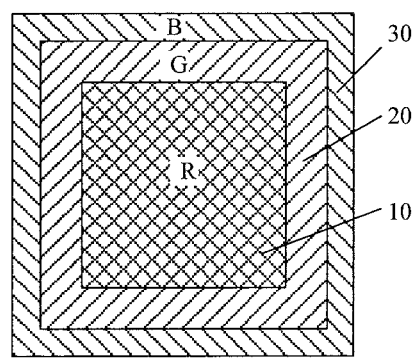
FIG. 6 is a schematic structural view of a pixel unit according to still another embodiment of the present disclosure.
Figure 9:
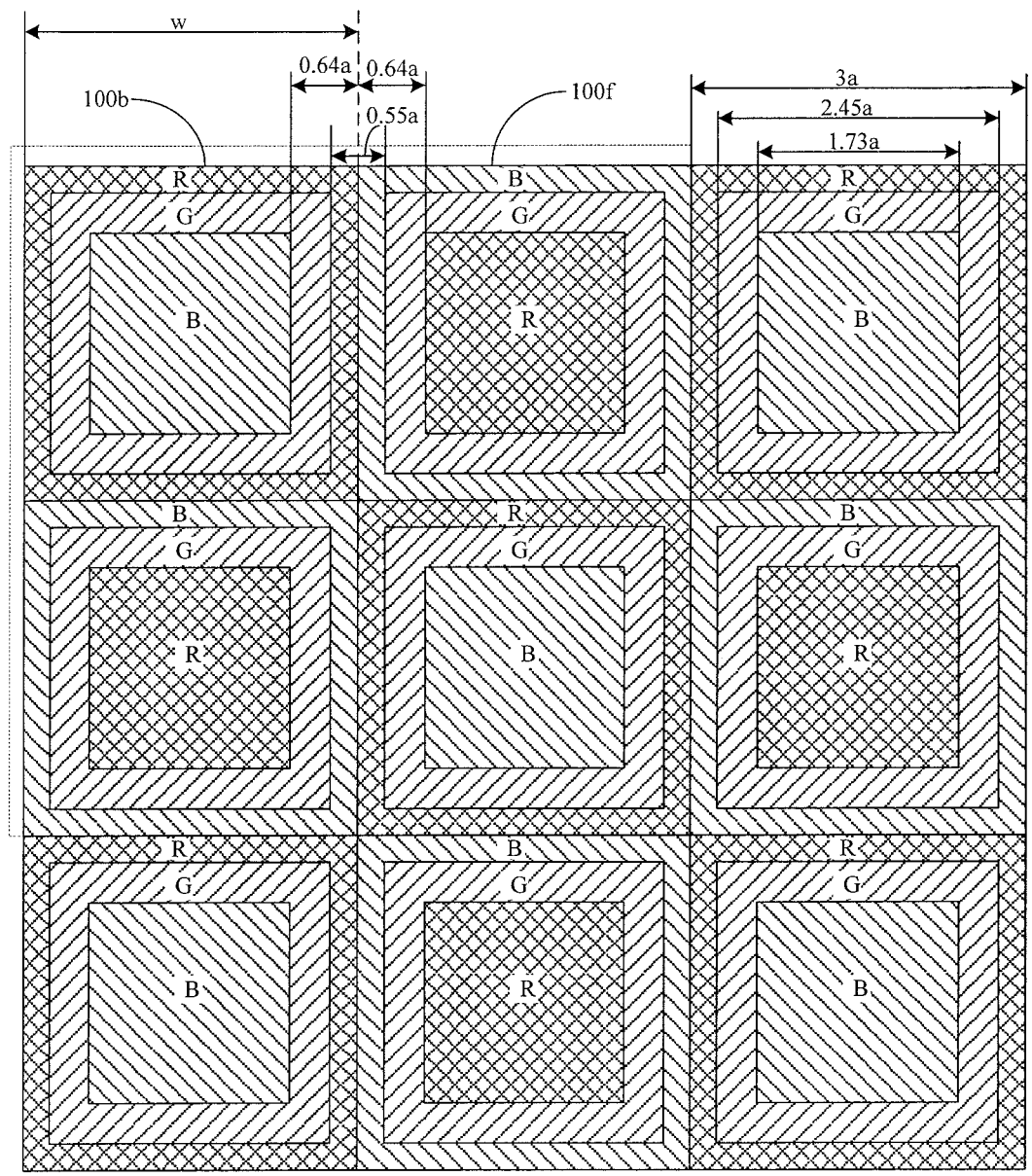
FIG. 9 is a schematic view of an exemplary arrangement of pixel units on a display substrate according to an embodiment of the present disclosure.

In an embodiment of the present disclosure, the illuminant color of the first sub-pixel region 10 of any one of two adjacent pixel units is the same as the illuminant color of the third sub-pixel region 30 of the other of the two adjacent pixel units. As an example, the illuminant color of the second sub-pixel region 20 of any one of the two adjacent pixel units is the same as the illuminant color of the second sub-pixel region 20 of the other of two adjacent pixel units. Specifically, as in the example of FIG. 9, the pixel unit 100b in FIG. 2 and the pixel unit 100f in FIG. 6 are alternately arranged on the display substrate. In this example, the distance between the adjacent red sub-pixel regions is the distance between the first sub-pixel region 10 in one pixel unit and the third sub-pixel region 30 in another pixel unit adjacent thereto. According to the above size assumption, the distance between the adjacent red sub-pixel regions is $(3a-6^{1/2}a)/2+(6^{1/2}a-3^{1/2}a)/2 \approx 0.64a$. Moreover, in this example, the distance between the adjacent green sub-pixel regions is the distance between the second sub-pixel region 20 in one pixel unit and the second sub-pixel region 20 in another pixel unit adjacent thereto. According to the above size assumption, the distance between the adjacent green sub-pixel regions is $(3a-6^{1/2}a) \approx 0.55a$. Similarly, the distance between the adjacent blue sub-pixel regions is also the distance between the first sub-pixel region 10 in one pixel unit and the third sub-pixel region 30 in another pixel unit adjacent thereto. According to the above size assumption, the distance between the adjacent blue sub-pixel regions is also $(3a-6^{1/2}a)/2+(6^{1/2}a-3^{1/2}a)/2 \approx 0.64a$. It should be noted that, although the alternate arrangement of the pixel unit 100b in FIG. 2 and the pixel unit 100f in FIG. 6 on the display substrate is illustrated in FIG. 9, the embodiments of the present disclosure are not limited thereto, for example, it is possible to adopt an alternate arrangement of the pixel unit 100a in FIG. 1 and the pixel unit 100e in FIG. 5 or an alternate arrangement of the pixel unit 100c in FIG. 3 and the pixel unit 100d in FIG. 4, to achieve the same effect.

As described above, for the standard RGB arrangement mode, the distance between the same-illuminant color sub-pixel regions in adjacent pixel units is 2a; for the PenTile arrangement mode, the distance between the same-illuminant color sub-pixel regions in adjacent pixel units is 2a or 4a. It can be seen that, in the case where the areas of the various sub-pixel regions remain unchanged, the separation distance between the same-illuminant color sub-pixel regions in adjacent pixel units may be significantly reduced by the arrangement mode of sub-pixels according to the above-described embodiments of the present disclosure. This is advantageous for the display of fine pictures and the display of color separation regions.

Figure 10:
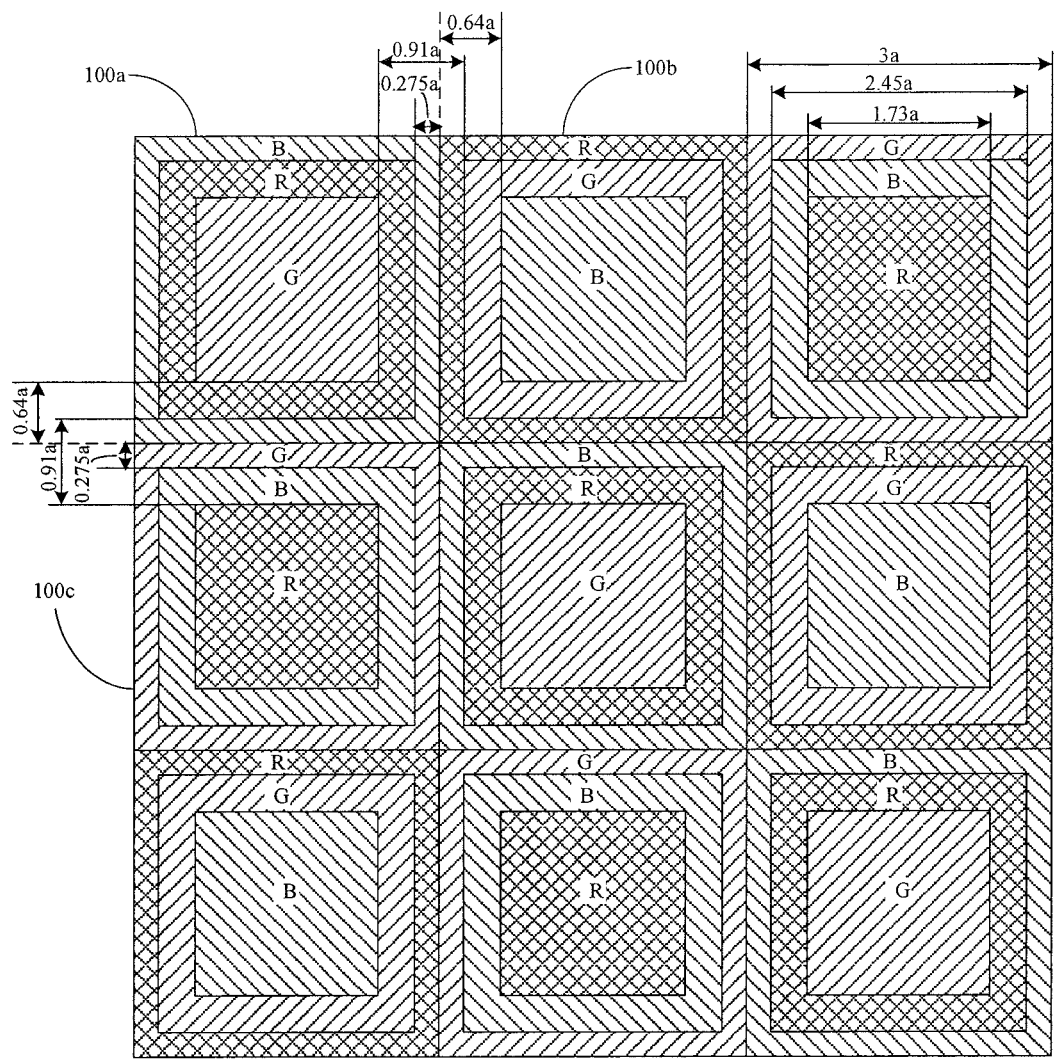
FIG. 10 is a schematic view of an exemplary arrangement of pixel units on a display substrate according to another embodiment of the present disclosure.

In another embodiment of the present disclosure, in two adjacent pixel units, the illuminant color of the first sub-pixel region 10 of the first pixel unit is the same as the illuminant color of the second sub-pixel region 20 of the second pixel unit, the illuminant color of the second sub-pixel region 20 of the first pixel unit is the same as the illuminant color of the third sub-pixel region 30 of the second pixel unit, and the illuminant color of the third sub-pixel region 30 of the first pixel unit is the same as the illuminant color of the first sub-pixel region 10 of the second pixel unit. FIG. 10 shows a specific example of a display substrate having pixel units arranged in this way. In the example shown in FIG. 10, the pixel unit 100a shown in FIG. 1, the pixel unit 100b shown in FIG. 2, and the pixel unit 100c shown in FIG. 3 are alternately arranged on the display substrate. In this example, there are two cases. For the pixel unit 100a in the upper left corner and the pixel unit 100b at the right side thereof, and the pixel unit 100a in the upper left corner and the pixel unit 100c at the lower side thereof, the distances between the same-illuminant color sub-pixel regions in the adjacent pixel units need to be considered independently.

In the former case, the pixel unit 100a in the upper left corner is regarded as the first pixel unit, and the pixel unit 100b located in the middle of the upper side is regarded as the second pixel unit. The distance between adjacent red sub-pixel regions is the distance between the second sub-pixel region 20 in the first pixel unit and the third sub-pixel region 30 in the second pixel unit adjacent thereto. According to the above size assumption, the distance between the adjacent red sub-pixel regions is $(3a-6^{1/2}a)/2 \approx 0.275a$. Moreover, in this example, the distance between adjacent green sub-pixel regions is the distance between the first sub-pixel region 10 in the first pixel unit and the second sub-pixel region 20 in the second pixel unit adjacent thereto. According to the above size assumption, the distance between the adjacent green sub-pixel regions is $(3a-3^{1/2}a)/2+(3a-6^{1/2}a)/2 \approx 0.91a$. The distance between adjacent blue sub-pixel regions is the distance between the third sub-pixel region 30 in the first pixel unit and the first sub-pixel region 10 in the second pixel unit adjacent thereto. According to the above size assumption, the distance between the adjacent blue sub-pixel regions is $(3a-3^{1/2}a)/2 \approx 0.64a$.

In the latter case, the pixel unit 100a in the upper left corner is regarded as the second pixel unit, and the pixel unit 100c located in the middle of the left side is regarded as the first pixel unit. The distance between adjacent red sub-pixel regions is the distance between the first sub-pixel region 10 in the first pixel unit and the second sub-pixel region 20 in the second pixel unit adjacent thereto. According to the above size assumption, the distance between the adjacent red sub-pixel regions is $(3a-3^{1/2}a)/2+(3a-6^{1/2}a)/2 \approx 0.91a$. Moreover, in this example, the distance between adjacent green sub-pixel regions is the distance between the third sub-pixel region 30 in the first pixel unit and the first sub-pixel region 10 in the second pixel unit adjacent thereto. According to the above size assumption, the distance between the adjacent green sub-pixel regions is $(3a-3^{1/2}a)/2 \approx 0.64a$. The distance between adjacent blue sub-pixel regions is the distance between the second sub-pixel region 20 in the first pixel unit and the third sub-pixel region 30 in the second pixel unit adjacent thereto. According to the above size assumption, the distance between the adjacent blue sub-pixel regions is $(3a-6^{1/2}a)/2 \approx 0.275a$.

In summary, in the example shown in FIG. 10, the separation distances between the same-illuminant color sub-pixel regions in adjacent pixel units do not exceed 0.91a, which is also significantly less than that of the standard RGB arrangement mode or the PenTile arrangement mode. It should be noted that, although the alternate arrangement of the pixel unit 100a in FIG. 1, the pixel unit 100b in FIG. 2, and the pixel unit 100c in FIG. 3 on the display substrate is illustrated in FIG. 10, the embodiments of the present disclosure are not limited thereto, and the sub-pixel regions in the various pixel units may have other illuminant colors. For example, it is possible to adopt a combination of the pixel unit 100b in FIG. 2, the pixel unit 100c in FIG. 3, and the pixel unit 100d in FIG. 4 on the display substrate, or a combination of the pixel unit 100c in FIG. 3, the pixel unit 100d in FIG. 4, and the pixel unit 100e in FIG. 5 on the display substrate, or a combination of the pixel unit 100d in FIG. 4, the pixel unit 100e in FIG. 5, and the pixel unit 100f in FIG. 6 on the display substrate, or a combination of the pixel unit 100e in FIG. 5, the pixel unit 100f in FIG. 6, and the pixel unit 100a in FIG. 1, and so on, to achieve the same effect.

Figure 2:
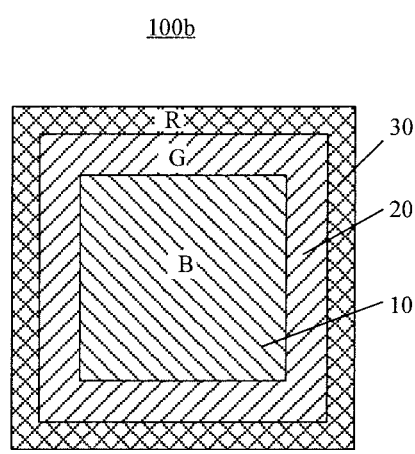
FIG. 2 is a schematic structural view of a pixel unit according to another embodiment of the present disclosure.
Figure 3:
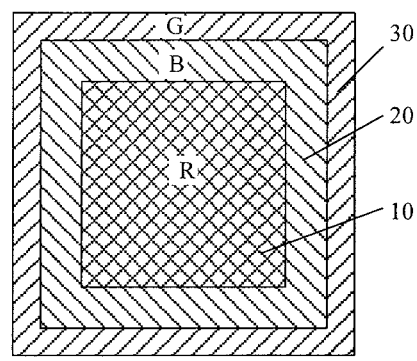
FIG. 3 is a schematic structural view of a pixel unit according to still another embodiment of the present disclosure.
Figure 4:
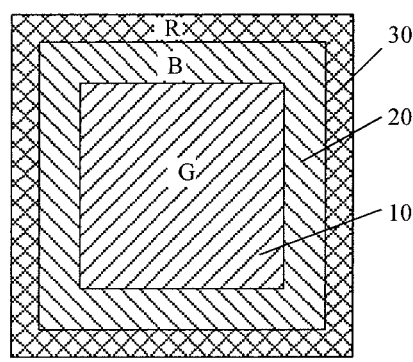
FIG. 4 is a schematic structural view of a pixel unit according to still another embodiment of the present disclosure.
Figure 5:
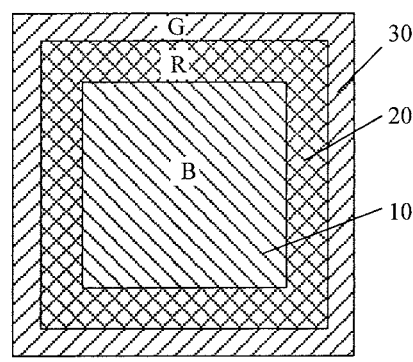
FIG. 5 is a schematic structural view of a pixel unit according to still another embodiment of the present disclosure.
Figure 11:
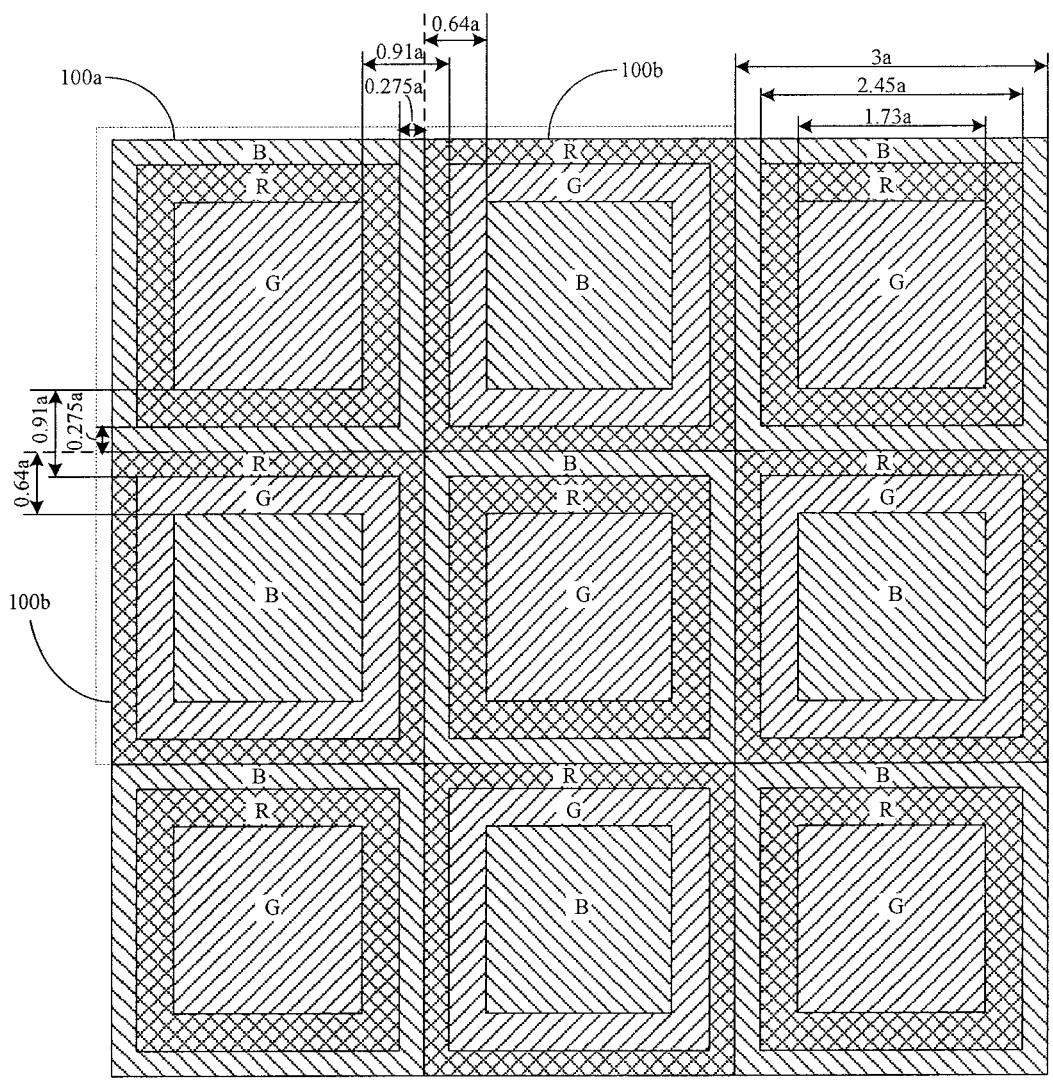
FIG. 11 is a schematic view of an exemplary arrangement of pixel units on a display substrate according to still another embodiment of the present disclosure.

In the example shown in FIG. 11, the structure in the example shown in FIG. 10 is simplified, only two kinds of pixel units, i.e., the pixel units 100a in FIG. 1 and the pixel units 100b in FIG. 2, are alternately arranged on the display substrate. According to the above size assumption, the distance between adjacent red sub-pixel regions can be calculated as $(3a-6^{1/2}a)/2 \approx 0.275a$, the distance between adjacent green sub-pixel regions can be calculated as $(3a-3^{1/2}a)/2+(3a-6^{1/2}a)/2 \approx 0.91a$, and the distance between adjacent blue sub-pixel regions can be calculated as $(3a-3^{1/2}a)/2 \approx 0.64a$. In the example shown in FIG. 11, the separation distances between the same-illuminant color sub-pixel regions in adjacent pixel units also do not exceed 0.91a, which is also significantly less than that of the standard RGB arrangement mode or the PenTile arrangement mode. The embodiments of the present disclosure are not limited to the arrangement of the pixel units as shown in FIG. 11, the sub-pixel regions in the various pixel units may have other illumination colors, for example, it is possible to adopt a combination of the pixel unit 100b in FIG. 2 and the pixel unit 100c in FIG. 3 on the display substrate, or a combination of the pixel unit 100c in FIG. 3 and the pixel unit 100a in FIG. 1 on the display substrate, or a combination of the pixel unit 100d in FIG. 4 and the pixel unit 100e in FIG. 5 on the display substrate, or a combination of the pixel unit 100e in FIG. 5 and the pixel unit 100f in FIG. 6, or a combination of the pixel unit 100d in FIG. 4 and the pixel unit 100f in FIG. 6, and so on, to achieve the same effect.

Figure 12:
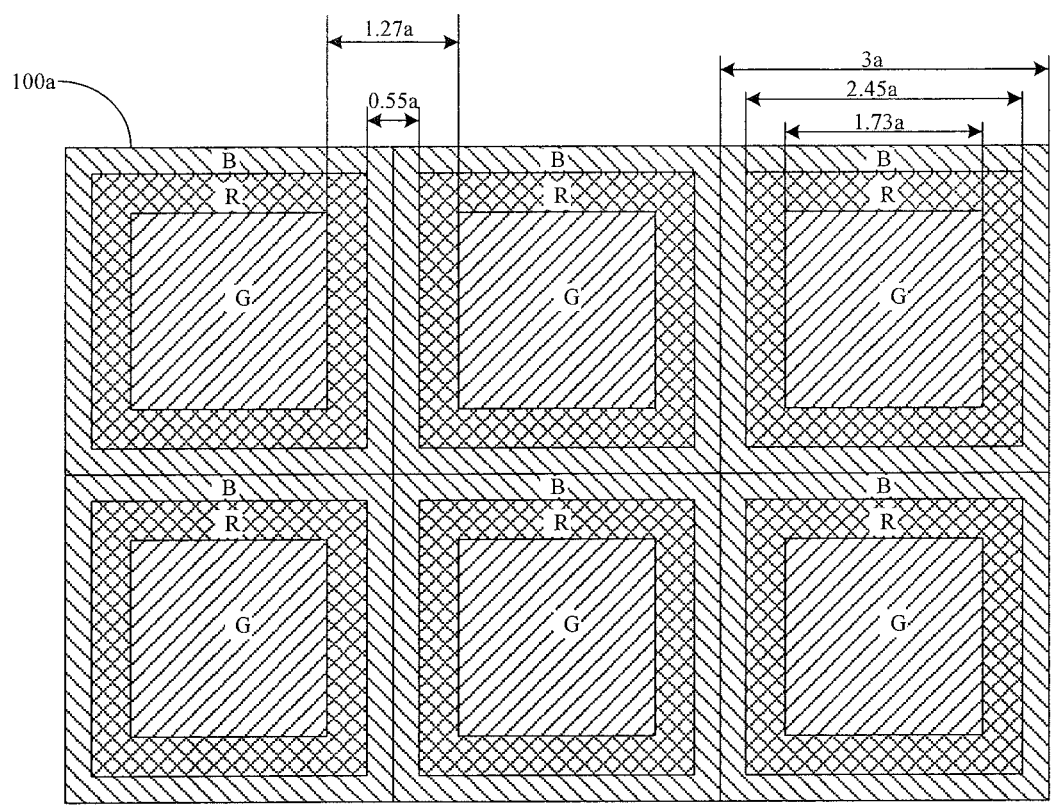
FIG. 12 is a schematic view of an exemplary arrangement of pixel units on a display substrate according to still another embodiment of the present disclosure.

In another embodiment of the present disclosure, in two adjacent pixel units, the first sub-pixel regions 10 each have a first illuminant color, the second sub-pixel regions 20 each have a second illuminant color, and the third sub-pixel regions 30 each have a third illuminant color. FIG. 12 shows a specific example. In the example shown in FIG. 12, only one kind of pixel units, that is, the pixel units 100a as shown in FIG. 1 is arranged on the display substrate. In this example, the distance between adjacent green sub-pixel regions is the distance between the first sub-pixel region 10 in one pixel unit and the first sub-pixel region 10 in another pixel unit adjacent thereto. According to the above size assumption, the distance between the adjacent green sub-pixel regions is $(3a-3^{1/2}a) \approx 1.27a$. Moreover, in this example, the distance between adjacent red sub-pixel regions is the distance between the second sub-pixel region 20 in one pixel unit and the second sub-pixel region 20 in another pixel unit adjacent thereto. According to the above size assumption, the distance between the adjacent red sub-pixel regions is $(3a-6^{1/2}a) \approx 0.55a$. The distance between adjacent blue sub-pixel regions is the distance between the third sub-pixel region 30 in one pixel unit and the third sub-pixel region 30 in another pixel unit adjacent thereto. According to the above size assumption, the distance between the adjacent blue sub-pixel regions is approximately zero. In the example shown in FIG. 12, the separation distances between the same-illuminant color sub-pixel regions in adjacent pixel units do not exceed 1.27a, which is also significantly less than that of the standard RGB arrangement mode or the PenTile arrangement mode. It should be noted that the pixel units 100a shown in FIG. 12 may be replaced by any of the pixel units shown in FIGS. 2 to 6 described above to achieve the same effect.

In the example shown in FIG. 12, the minimum repetitive unit of the pixel units includes only one pixel unit. In the examples shown in FIGS. 9 and 11, the minimum repetitive unit of the pixel units includes four pixel units (as indicated by the dashed box). In the example shown in FIG. 10, the minimum repetitive unit of the pixel units includes nine pixel units as shown. As can be seen from the above description, the maximum value of the separation distance between the same-illuminant color sub-pixel regions in adjacent pixel units on the display substrate in the example shown in FIG. 9 is less than those in the other examples shown in FIGS. 10 to 12, and therefore the display effect is better.

Figure 13:
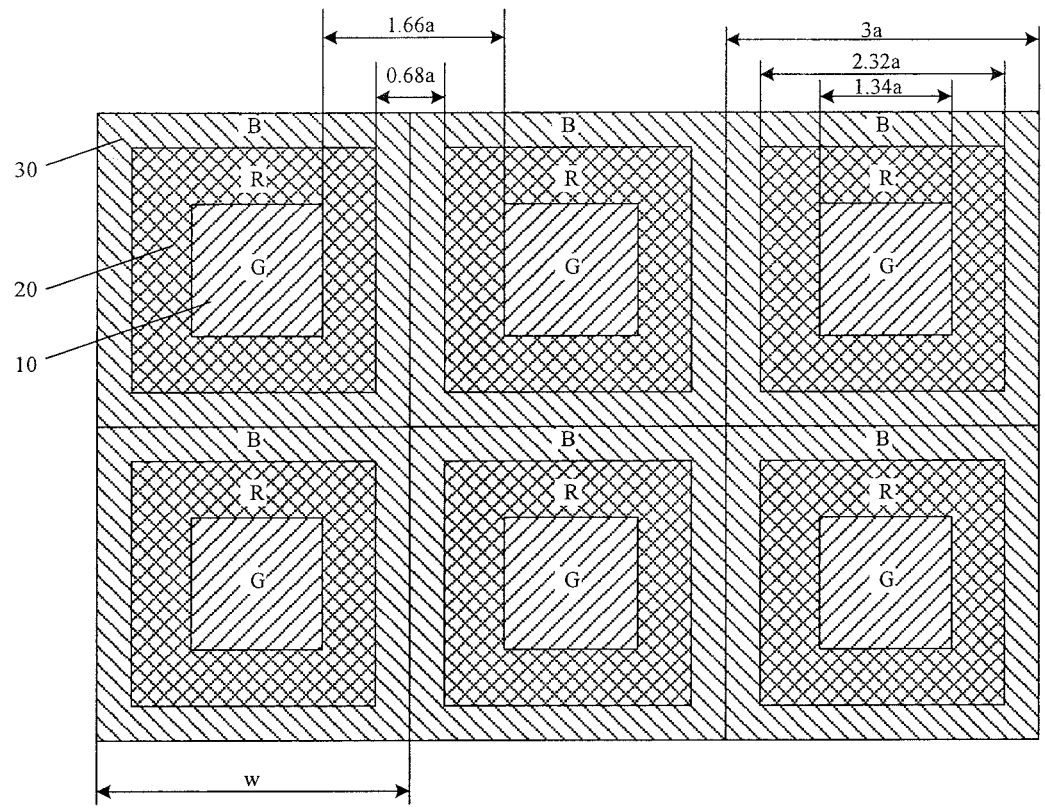
FIG. 13 is a schematic view of an exemplary arrangement of pixel units on a display substrate according to still another embodiment of the present disclosure.

In the examples shown in FIGS. 9 to 12 described above, the areas of the various sub-pixel regions in the same pixel unit are all equal. However, the embodiments of the present disclosure are not limited thereto, for example, the area of one certain sub-pixel region in the same pixel unit may be less than the areas of other sub-pixel regions. FIG. 13 shows a specific example. In the example of FIG. 13, the area of the second sub-pixel region is equal to the area of the third sub-pixel region, but the area of the first sub-pixel region is half of the area of any of the second sub-pixel region and the third sub-pixel region. The single pixel unit can still be regarded as a square having a side length of 3a, then the first sub-pixel region 10 has a side length of $3*5^{(-1/2)}a$ (about 1.34a), a side length of the outer side of the second sub-pixel region 20 is $3*0.6^{1/2}a$ (about 2.32a), and the third sub-pixel region 30 has a side length of 3a. For example, the illuminant color of the first sub-pixel region 10 is green, the illuminant color of the second sub-pixel region 20 is red, and the illuminant color of the third sub-pixel region 30 is blue. By means of setting the area of the red sub-pixel region and the area of the blue sub-pixel region to be twice the area of the green sub-pixel region, it is advantageous for increasing the color temperature and increasing the visual brightness.

FIG. 13 shows that all the pixel units on the display substrate are the pixel units as described above. The distance between adjacent green sub-pixel regions is $(3a-3*5^{(-1/2)}a) \approx 1.66a$, the distance between adjacent red sub-pixel regions is $(3a-3*0.6^{1/2}a) \approx 0.68a$, and the distance between adjacent blue sub-pixel regions is approximately zero. It can be seen that in the example shown in FIG. 13, the separation distances between the same-illuminant color sub-pixel regions in adjacent pixel units do not exceed 1.66a, which is also significantly less than that of the standard RGB arrangement mode or the PenTile arrangement mode.

In the example of the standard RGB arrangement mode shown in FIG. 7, the single pixel unit (including R, G, B sub-pixel regions) has a width of 3a, the same-illuminant color sub-pixel regions in two adjacent pixel units are separated by two sub-pixel regions, that is, the separation distance between the same-illuminant color sub-pixel regions in the two adjacent pixel units is a sum of widths of two sub-pixel regions, 2a, or in other words, the separation distance between the same-illuminant color sub-pixel regions in the two adjacent pixel units is two-thirds of the width of the single pixel unit. Similarly, in the example of the PenTile arrangement mode shown in FIG. 8, the single pixel unit (including R, G sub-pixel regions or B, G sub-pixel regions) has a width of 3a, the separation distance between the same-illuminant color sub-pixel regions in the two adjacent pixel units is 2a (for example the separation distance between adjacent green sub-pixels) or 4a (for example the separation distance between adjacent blue or red sub-pixels), which is also not less than two-thirds of the width of the single pixel unit.

In some embodiments of the present disclosure, the separation distances between the same-illuminant color sub-pixel regions in two adjacent pixel units may all be less than two-thirds of the width of any one of the pixel units, for example, the examples shown in FIG. 9 to FIG. 13 are the case. A detailed description will be given by taking FIG. 13 as an example. As described above, the shape of each pixel unit in FIG. 13 is a square having a side length of 3a, and therefore the width w of the single pixel unit is 3a. The separation distance between the sub-pixel regions refers to the distance between the edges of the sub-pixel regions facing to each other. For example, in all the pixel units in FIG. 13, the first sub-pixel regions are all green sub-pixel regions, the second sub-pixel regions are all red sub-pixel regions, and the third sub-pixel regions are all blue sub-pixel regions. Therefore, the separation distance between the sub-pixel regions having the same green illuminant color in two adjacent pixel units (for example, the pixel unit in the upper left corner and the pixel unit in the middle of the upper side) is the distance between edges of the first sub-pixel regions of these two pixel unit facing to each other (for example, the distance from a right edge of the first sub-pixel region of the pixel unit in the upper left corner to a left edge of the first sub-pixel region of the pixel unit in the middle of the upper side), which is marked with a value of 1.66a. Similarly, the separation distance between the sub-pixel regions having the same red illuminant color in two adjacent pixel units (for example, the pixel unit in the upper left corner and the pixel unit in the middle of the upper side) is the distance between edges of the second sub-pixel regions of these two pixel unit facing to each other (for example, the distance from a right edge of the second sub-pixel region of the pixel unit in the upper left corner to a left edge of the second sub-pixel region of the pixel unit in the middle of the upper side), which is marked with a value of 0.68a. The distance between the sub-pixel regions having the same blue illuminant color in the pixel unit in the upper left corner and the pixel unit in the middle of the upper side in FIG. 13 can be negligible, because the right edge of the third sub-pixel region of the pixel unit in the upper left corner and the left edges of the third sub-pixel region of the pixel unit in the middle of the upper side are adjacent to each other. It can be seen that, in the example shown in FIG. 13, the separation distances between the same-illuminant color sub-pixel regions in two adjacent pixel units are at most not more than 1.66a, and are less than two-thirds of the width of any one of the pixel units (2a). This can ensure that the separation distances between the same-illuminant color sub-pixel regions in two adjacent pixel units are less than that of the standard RGB arrangement mode or the PenTile arrangement mode, to obtain a more delicate display effect than them. Thus, in order to obtain better definition when displaying a fine picture, as an example, the separation distances between the same-illuminant color sub-pixel regions in two adjacent pixel units may each be less than one-third of the width of any one of the pixel units. For example, the examples shown in FIGS. 9 to 11 described above are the case. This can further improve the display effect. For example, in FIG. 9, in the pixel unit 100b in the upper left corner, the first sub-pixel region is a blue sub-pixel region, the second sub-pixel region is a green sub-pixel region, and the third sub-pixel region is a red sub-pixel region. In the pixel unit 100f in the middle of the upper side in FIG. 9, the first sub-pixel region is a red sub-pixel region, the second sub-pixel region is a green sub-pixel region, and the third sub-pixel region is a blue sub-pixel region. Therefore, the separation distance between the sub-pixel regions having the same blue illuminant color in the two adjacent pixel units 100b and 100f is 0.64a, the separation distance between the sub-pixel regions having the same green illuminant color in the two adjacent pixel units 100b and 100f is 0.55a, and the separation distance between the sub-pixel regions having the same red illuminant color in the two adjacent pixel units 100b and 100f is 0.64a. It can be seen that, in the example shown in FIG. 9, the separation distances between the same-illuminant color sub-pixel regions in two adjacent pixel units are at most not more than 0.64a, and are less than one-third of the width of the single pixel unit (1a).

When the display substrate according to the embodiments of the present disclosure performs a black and white display or a pure color display, the separation distance between adjacent same-illuminant color sub-pixels is less than that of the standard RGB arrangement mode or the PenTile arrangement mode. Therefore, in the case where the product resolution is high, naked eyes generally recognize that the edge of the color separation region is linear and non-wavy. Moreover, a fine picture can also be displayed clearly when displaying it.

When manufacturing the pixel unit according to the embodiments of the present disclosure, it is only necessary to use a corresponding mask pattern manufactured in terms of a designed arrangement and manufacture it by using a conventional pixel unit manufacturing process.

The embodiments of the present disclosure are not limited to the specific embodiments described above, and those skilled in the art can determine the sizes and the illuminant colors of the various sub-pixel regions in the pixel units and the arrangement of the pixel units as needed.

Figure 14:
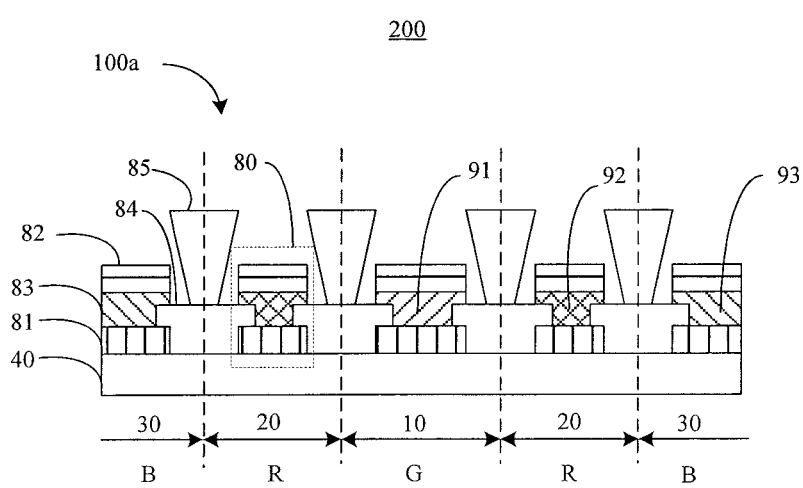
FIG. 14 is an exemplary partial cross-sectional view of a display substrate according to an embodiment of the present disclosure.

FIG. 14 is an exemplary partial cross-sectional view of a display substrate according to an embodiment of the present disclosure. The display substrate 200 includes a base substrate 40 and a plurality of pixel units disposed on the base substrate 40. The portion of the display substrate shown in FIG. 14 corresponds to the pixel unit 100a in FIG. 1. The pixel unit 100a includes a first sub-pixel region 10, a second sub-pixel region 20, and a third sub-pixel region 30. In view of the structure of one-surrounding-one arrangement or nested ring, the second sub-pixel region 20 is disposed around the periphery of the first sub-pixel region 10 and the third sub-pixel region 30 is disposed around the periphery of the second sub-pixel region 20. In an example, the pixel unit 100a includes an organic light emitting diode 80 for forming respective sub-pixel regions. Each organic light emitting diode 80 may include, for example, an anode 81, a cathode 82, and organic luminescent material layers 83 between the anode 81 and the cathode 82. As an example, the organic light emitting diode 80 may further include a hole injection layer, a hole transport layer, an electron transport layer, an electron injection layer, and the like to improve luminous efficiency. However, the embodiments of the present disclosure are not limited thereto, and other well-known light emitting structures (for example, well-known OLED light emitting structures) may also be employed. As an example, the organic luminescent material layers 83 corresponding to different sub-pixel regions may be separated by isolation layers 84, and the cathode 82 corresponding to different sub-pixel regions may be separated by isolation columns 85. In order to prevent short circuits between adjacent sub-pixel regions, the isolation columns 85 may be formed in an inverted trapezoidal shape. In some embodiments of the present disclosure, the base substrate may be a substrate made of a transparent material such as glass, resin, or the like for supporting the light emitting device. As an example, a first color layer pattern 91, a second color layer pattern 92, and a third color layer pattern 93 are formed from organic luminescent material layers 83 of different colors in the first sub-pixel region 10, the second sub-pixel region 20, and the third sub-pixel region 30, respectively. The first color layer pattern 91, the second color layer pattern 92, and the third color layer pattern 93 may be used to form the illuminant colors of the respective sub-pixel regions.

Although the embodiments of the present disclosure have been described above by taking pixel units of RGB three primary colors as an example, it should be understood by those skilled in the art that the embodiments of the present disclosure are not limited thereto. The sub-pixel regions in the pixel unit may have any other illuminant colors, for example yellow, and the number of the sub-pixel regions in the pixel unit is not limited to three, for example, four or more sub-pixel regions may be included in a single pixel unit.

Although the embodiments of the present disclosure have been described above by taking a first sub-pixel region of a square as an example, it should be understood by those skilled in the art that the embodiments of the present disclosure are not limited thereto. The first sub-pixel region may have other shapes, such as a rectangle, a circle, a diamond, a hexagon, or even an irregular shape.

FIG. 14 merely shows an example of a display substrate according to an embodiment of the present disclosure. However, the embodiments of the present disclosure are not limited thereto, and other structures known in the related art for generating an OLED display substrate may also be employed, for example, a monochromatic OLED structure or a white light OLED structure combined with a color filter, or the like. Moreover, the embodiments of the present disclosure are not limited to an OLED pixel unit and a display substrate. The present disclosure is intended to provide a novel arrangement mode of sub-pixels in a pixel unit and an arrangement of pixel units on a display substrate, and may also be applied to the display devices other than the OLED display device, such as a quantum dot light emitting display device, an inorganic light emitting diode display device, a liquid crystal display device, and the like.

Figure 15:
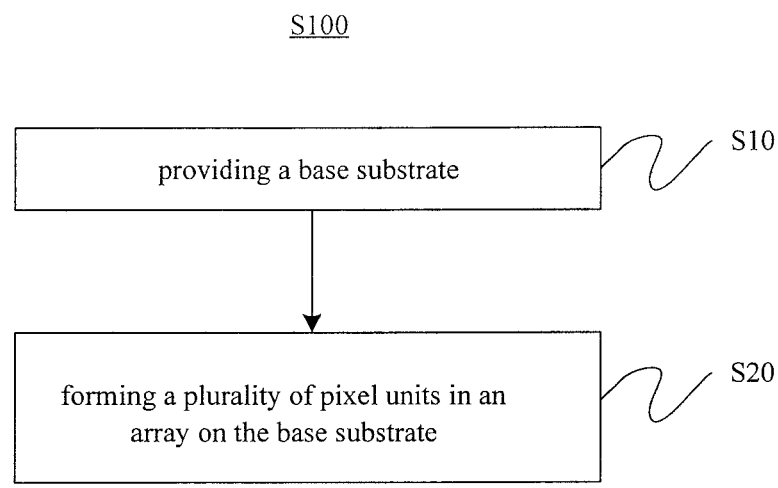
FIG. 15 is a flow chart of a method for manufacturing a display substrate according to an embodiment of the present disclosure.

Embodiments of the present disclosure also provide a method for manufacturing a display substrate S100. As shown in FIG. 15, the method S100 includes:

Step S10: providing a base substrate; and

Step S20: forming a plurality of pixel units arranged in an array on the base substrate.

As described above, each of the pixel units includes: a first sub-pixel region; a second sub-pixel region located at a periphery of the first sub-pixel region and surrounding the first sub-pixel region; and a third sub-pixel region located at a periphery of the second sub-pixel region and surrounding the second sub-pixel region.

In some embodiments, the above step S20 may include:

forming a first color layer pattern 91 in the first sub-pixel region 10, a second color layer pattern 92 in the second sub-pixel region 20, and a third color layer pattern 93 in the third sub-pixel region 30 on the base substrate, respectively. In each pixel unit, the second color layer pattern surrounds the first color layer pattern, and the third color layer pattern surrounds the second color layer pattern.

As described above, the first sub-pixel region 10, the second sub-pixel region 20, and the third sub-pixel region 30 may have different illuminant colors from each other. Their illuminant colors may be provided by the first color layer pattern 91, the second color layer pattern 92, and the third color layer pattern 93, respectively. Herein, the shape and position of the first color layer pattern 91 may correspond to the first sub-pixel region 10, that is, the first color layer pattern 91 is located in the first sub-pixel region 10 and has a shape that is generally the same as that of the first sub-pixel region 10. Likewise, the shapes and positions of the second color layer pattern 92 and the third color layer pattern 93 may correspond to the second sub-pixel region 20 and the third sub-pixel region 30, respectively. Therefore, in the same pixel unit, the second color layer pattern 92 would be located at the periphery of the first color layer pattern 91 and surround the first color layer pattern 91, and the third color layer pattern 93 would be located at the periphery of the second color layer pattern 92 and surround the second color layer pattern 92.

As an example, when the illuminant colors of the first sub-pixel region 10, the second sub-pixel region 20, and the third sub-pixel region 30 are determined by the illuminant colors of the luminescent material layers (for example, each sub-pixel region corresponds to a monochromatic OLED), the first color layer pattern, the second color layer pattern, and the third color layer pattern may be formed of luminescent material layers (for example, organic or inorganic luminescent material layers) of different colors, respectively. When the illuminant colors of the first sub-pixel region 10, the second sub-pixel region 20, and the third sub-pixel region 30 are determined by the colors of the color filter layers (for example, using a white light OLED structure combined with color filter layers), the first color layer pattern 91, the second color layer pattern 92, and the third color layer pattern 93 may be formed of color filter layers of different colors, respectively. The first color layer pattern 91, the second color layer pattern 92, and the third color layer pattern 93 may be manufactured by a process such as evaporation, inkjet printing, photolithography, and those skilled in the art can choose a specific process according to the property of the material, the manufacturing cost, and the like.

It should be understood by those skilled in the art that, in addition to the color layer patterns described above, it is also necessary to provide known film layer structures such as a cathode, an anode, an insulating layer or the like on the display substrate to achieve the necessary functions. These film layers may be selected as desired and manufactured by a manufacturing process known in the related art. Since only the known technologies in the art are involved, these film layer structures and their manufacturing processes will not be described in detail herein.

The present disclosure has been described with reference to the accompanying drawings, but the embodiments involved in the drawings are only illustrative of the present disclosure and should not be construed as limiting the present disclosure. The dimension scales in the drawings are merely illustrative and should not be construed as limiting the present disclosure.

The above-described embodiments are merely illustrative of the principle and construction of the present disclosure, and are not intended to limit the present disclosure. it should be appreciated by those skilled in the art that any changes or improvements to the present disclosure without departing from the general concept of the present disclosure fall within the scope of the present disclosure. The scope of the present disclosure should be defined by the claim set of the present disclosure.

What is claimed is:

1. A pixel unit, comprising:
a first sub-pixel region;
a second sub-pixel region located at a periphery of the first sub-pixel region and surrounding the first sub-pixel region; and
a third sub-pixel region located at a periphery of the second sub-pixel region and surrounding the second sub-pixel region,
wherein an area of the second sub-pixel region is equal to an area of the third sub-pixel region, and an area of the first sub-pixel region is half of the area of the second sub-pixel region,
wherein an illuminant color of the first sub-pixel region is green, an illuminant color of the second sub-pixel region is red, and an illuminant color of the third sub-pixel region is blue,
wherein a ratio of a side length of the first sub-pixel region, a side length of the second sub-pixel region to a side length of the third sub-pixel region is $3*5^{(-1/2)}$: $3*0.6^{1/2}$:3.

2. The pixel unit according to claim 1, wherein the first sub-pixel region has a square shape.

3. The pixel unit according to claim 1, wherein centers of the first sub-pixel region, the second sub-pixel region, and the third sub-pixel region coincide with each other.

4. The pixel unit according to claim 1, wherein the pixel unit comprises a light emitting diode.

5. The pixel unit according to claim 1, wherein centers of the first sub-pixel region, the second sub-pixel region, and the third sub-pixel region do not coincide with each other.

6. The pixel unit according to claim 1, wherein the pixel unit further comprises at least one additional sub-pixel region other than the first sub-pixel region, the second sub-pixel region, and the third sub-pixel region, and the at least one additional sub-pixel region surrounds the third sub-pixel region or surrounds the periphery of the third sub-pixel region in a one-surrounding-one manner.

7. A display substrate, comprising:
a base substrate; and
a plurality of pixel units according to claim 1 arranged in an array on the base substrate.

8. The display substrate according to claim 7, wherein, in two adjacent pixel units, an illuminant color of the first sub-pixel region of one of the pixel units and an illuminant color of the third sub-pixel region of the other of the pixel units are same.

9. The display substrate according to claim 8, wherein, in the two adjacent pixel units, an illuminant color of the second sub-pixel region of the one of the pixel units and an illuminant color of the first sub-pixel region of the other of the pixel units are same; or
wherein, in the two adjacent pixel units, the illuminant color of the second sub-pixel region of the one of the pixel units and an illuminant color of the second sub-pixel region of the other of the pixel units are same.

10. The display substrate according to claim 7, wherein, in two adjacent pixel units, an illuminant color of the first sub-pixel region of a first pixel unit and an illuminant color of the second sub-pixel region of a second pixel unit are same, an illuminant color of the second sub-pixel region of the first pixel unit and an illuminant color of the third sub-pixel region of the second pixel unit are same, and an illuminant color of the third sub-pixel region of the first pixel unit and an illuminant color of the first sub-pixel region of the second pixel unit are same.

11. The display substrate according to claim 7, wherein, in two adjacent pixel units, an illuminant color of the first sub-pixel region of a first pixel unit and an illuminant color of the second sub-pixel region of a second pixel unit are same, an illuminant color of the second sub-pixel region of the first pixel unit and an illuminant color of the first sub-pixel region of the second pixel unit are same, and an illuminant color of the third sub-pixel region of the first pixel unit and an illuminant color of the third sub-pixel region of the second pixel unit are same.

12. The display substrate according to claim 7, wherein, in two adjacent pixel units, an illuminant color of the first sub-pixel region of a first pixel unit and an illuminant color of the first sub-pixel region of a second pixel unit are same, an illuminant color of the second sub-pixel region of the first pixel unit and an illuminant color of the third sub-pixel region of the second pixel unit are same, and an illuminant color of the third sub-pixel region of the first pixel unit and an illuminant color of the second sub-pixel region of the second pixel unit are same.

13. The display substrate according to claim 7, wherein, in two adjacent pixel units, the first sub-pixel regions each have a first illuminant color, the second sub-pixel regions each have a second illuminant color, and the third sub-pixel regions each have a third illuminant color.

14. The display substrate according to claim 7, wherein a separation distance between sub-pixel regions having a same illuminant color in two adjacent pixel units is less than two-thirds of a width of any one of the pixel units.

15. A method for manufacturing a display substrate, comprising:
providing a base substrate;
forming a plurality of pixel units in an array on the base substrate,
wherein each of the pixel units comprises:
a first sub-pixel region;
a second sub-pixel region located at a periphery of the first sub-pixel region and surrounding the first sub-pixel region; and
a third sub-pixel region located at a periphery of the second sub-pixel region and surrounding the second sub-pixel region, wherein an area of the second sub-pixel region is equal to an area of the third sub-pixel region, and an area of the first sub-pixel region is half of the area of the second sub-pixel region, wherein an illuminant color of the first sub-pixel region is green, an illuminant color of the second sub-pixel region is red, and an illuminant color of the third sub-pixel region is blue, wherein a ratio of a side length of the first sub-pixel region, a side length of the second sub-pixel region to a side length of the third sub-pixel region is $3*5^{(-1/2)}:3*0.6^{1/2}:3$.

16. The method according to claim 15, wherein the forming a plurality of pixel units in an array on the base substrate comprises:

forming a first color layer pattern in the first sub-pixel region, a second color layer pattern in the second sub-pixel region, and a third color layer pattern in the third sub-pixel region on the base substrate, respectively, wherein, in each pixel unit, the second color layer pattern surrounds the first color layer pattern, and the third color layer pattern surrounds the second color layer pattern.

17. The method according to claim 16, wherein the first color layer pattern, the second color layer pattern, and the third color layer pattern are respectively made from luminescent material layers of different colors or color filter layers of different colors.

* * * * *